United States Patent
Han (10) Patent No.: US 7,859,072 B2
(45) Date of Patent: Dec. 28, 2010

(54) IMAGE SENSOR AND METHOD FOR MANUFACTURING THE SAME

(75) Inventor: Chang Hun Han, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 576 days.

(21) Appl. No.: 11/839,236

(22) Filed: Aug. 15, 2007

(65) Prior Publication Data

US 2008/0042228 A1   Feb. 21, 2008

(30) Foreign Application Priority Data

Aug. 21, 2006 (KR) .................. 10-2006-0078863

(51) Int. Cl.
  *H01L 21/00* (2006.01)
  *H01L 31/0216* (2006.01)
(52) U.S. Cl. .............. 257/432; 257/431; 257/434; 257/435; 257/464; 257/E21.001; 257/E27.132; 257/E27.134; 257/E27.142; 438/59; 438/70
(58) Field of Classification Search .......... 257/431, 257/432, 434, 435, 464, E21.001, E27.132, 257/E27.134, E27.142; 438/59, 70
See application file for complete search history.

(56) References Cited

U.S. PATENT DOCUMENTS

| | | | |
|---|---|---|---|
| 6,379,992 B2 * | 4/2002 | Jo | 438/70 |
| 7,015,992 B2 * | 3/2006 | Nakayoshi et al. | 349/106 |
| 2003/0137631 A1 | 7/2003 | Nakayoshi et al. | |
| 2006/0163208 A1 | 7/2006 | Park et al. | |
| 2008/0074520 A1 * | 3/2008 | Matsuda et al. | 348/294 |
| 2009/0294886 A1 * | 12/2009 | Hsu et al. | 257/432 |

FOREIGN PATENT DOCUMENTS

| | | |
|---|---|---|
| JP | 2000-031441 A | 1/2000 |
| JP | 2004-241524 A | 8/2004 |
| KR | 10-2002-0034311 | 5/2002 |
| KR | 10-2003-0052640 | 6/2003 |

* cited by examiner

*Primary Examiner*—Dao H Nguyen
(74) *Attorney, Agent, or Firm*—Saliwanchik, Lloyd & Saliwanchik (57) ABSTRACT

An image sensor and a fabricating method thereof are provided. The image sensor includes a plurality of pixels disposed in an active region and dummy pixels disposed in a peripheral region. An interlayer dielectric layer has a first thickness in the active region and a second thickness thinner than the first thickness in the peripheral region. Color filters are disposed in the active region, and a light blocking member is disposed in the peripheral region. There is substantially no step difference between the color filters and the light blocking member.

6 Claims, 8 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2006-0078863, filed Aug. 21, 2006, which is hereby incorporated by reference in its entirety.

BACKGROUND

In general, an image sensor is a semiconductor device for converting optical images into electric signals, and is mainly classified as a charge coupled device (CCD) or a Complementary Metal Oxide Semiconductor (CMOS) image sensor.

A CMOS image sensor typically includes a photodiode and a MOS transistor in each unit pixel, and sequentially detects the electric signals of each unit pixel in a switching mode to generate images.

A CMOS image sensor includes a plurality of pixels to detect light. The pixels often include a photodiode, a plurality of transistors to drive the photodiode, an interlayer dielectric layer covering the photodiode, color filters provided on the interlayer dielectric layer corresponding to the photodiode, a planar layer provided on the color filters, and a microlens provided on the planar layer over the color filters.

The pixels of the CMOS image sensor are disposed in an active region, and a light blocking region is typically formed in the vicinity of the active region. In the light blocking region, the color filters often overlap with each other to block incident light.

Since the planar layer covers the color filters overlapping with each other, the planar layer is often very thick, thereby reducing the incident light in the photodiode.

BRIEF SUMMARY

Embodiments of the present invention provide an image sensor and a method for manufacturing the same, capable of reducing the loss of incident light to a photodiode.

According to an embodiment, an image sensor includes a plurality of pixels disposed in an active region and dummy pixels disposed in a peripheral region. An interlayer dielectric layer covers the active region and the peripheral region, and has a first thickness in the active region and a second thickness in the peripheral region, such that the first thickness is larger than the second thickness. Color filters are disposed in the active region, and a light blocking member is disposed in the peripheral region. There is substantially no step difference between the color filters and the light blocking member. A planar layer is provided on the color filters and the light blocking member and may be very thin.

According to an embodiment, a method for manufacturing an image sensor includes the steps of forming pixels in an active region and dummy pixels in a peripheral region. An interlayer dielectric layer can be formed to have a first thickness in the active region and a second thickness in the peripheral region, such that the first thickness is larger than the second thickness. A light blocking member can be formed in the peripheral region, and color filters can be formed in the active region. There is substantially no step difference between the color filters and the light blocking member. A planarization layer can be formed on the color filters and the light blocking member, and the planarization layer may be very thin.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
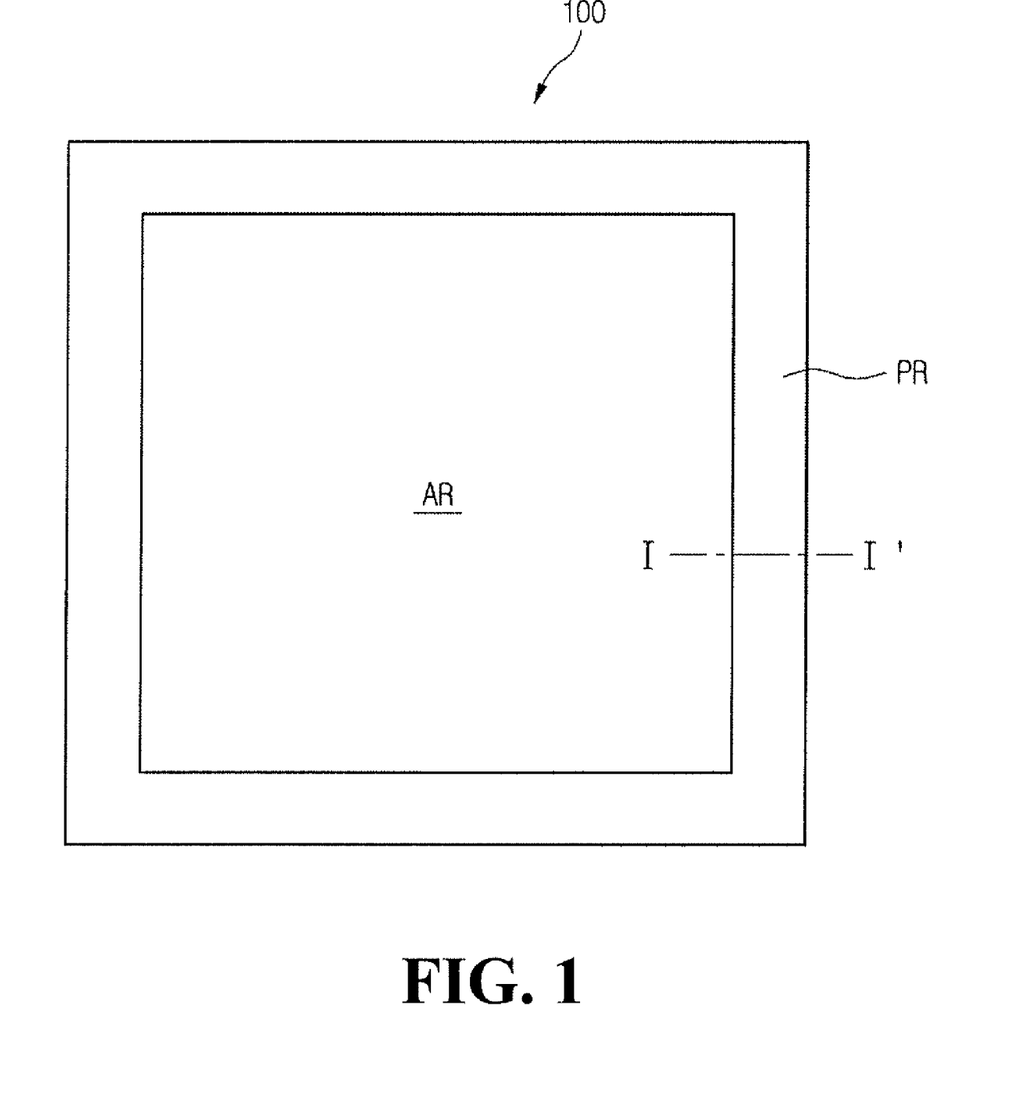
FIG. 1 is a plan view showing an image sensor according to an embodiment of the present invention.

Referring to FIG. 1, an image sensor 100, according to an embodiment, includes an active region AR and a peripheral region PR.

A plurality of pixels are provided on a substrate in the active region AR of the image sensor 100. Each pixel P detects and outputs incident external light.

Figure 2:
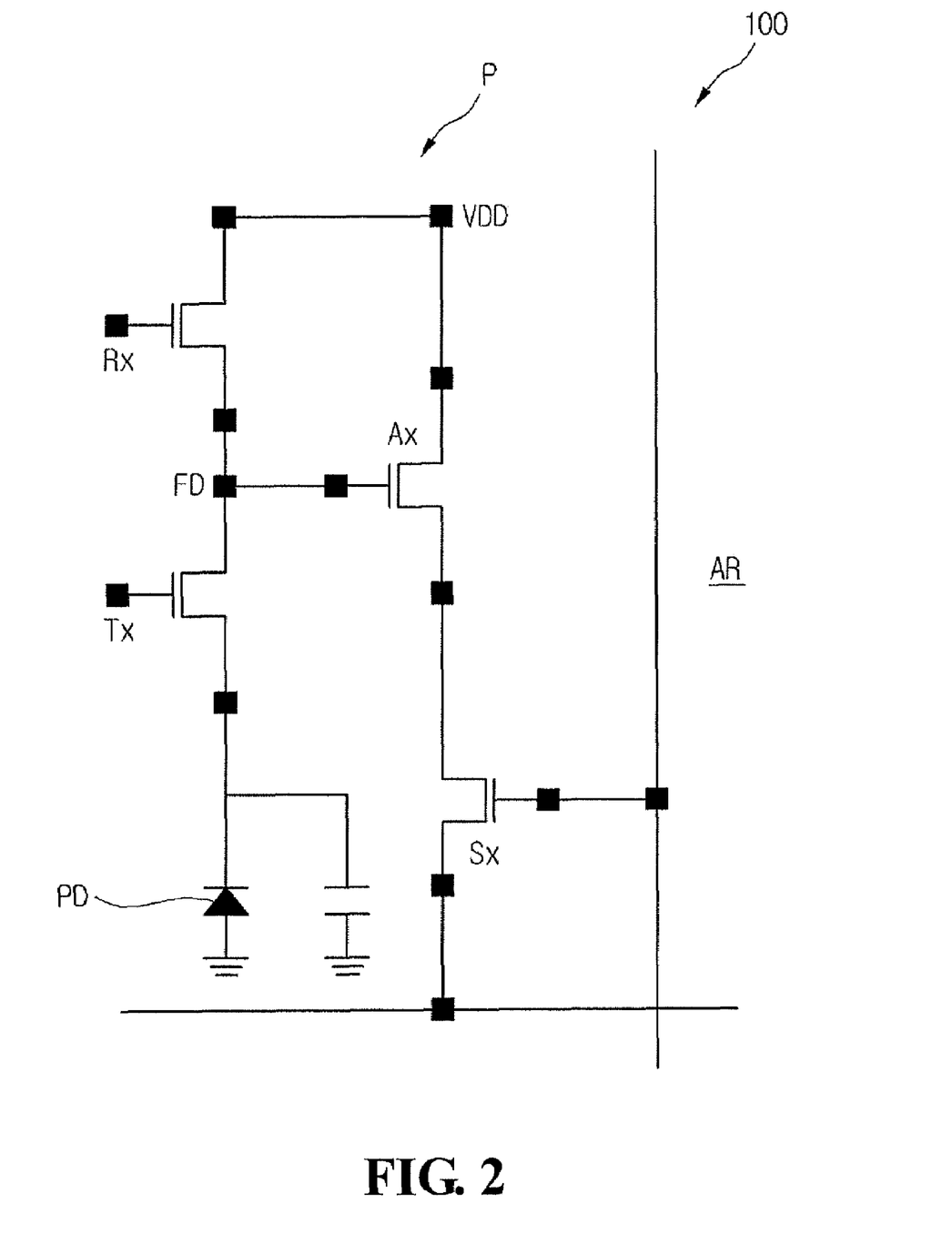
FIG. 2 is a schematic view of a pixel that may be provided in an active region of an image sensor according to an embodiment of the present invention.
Figure 3:
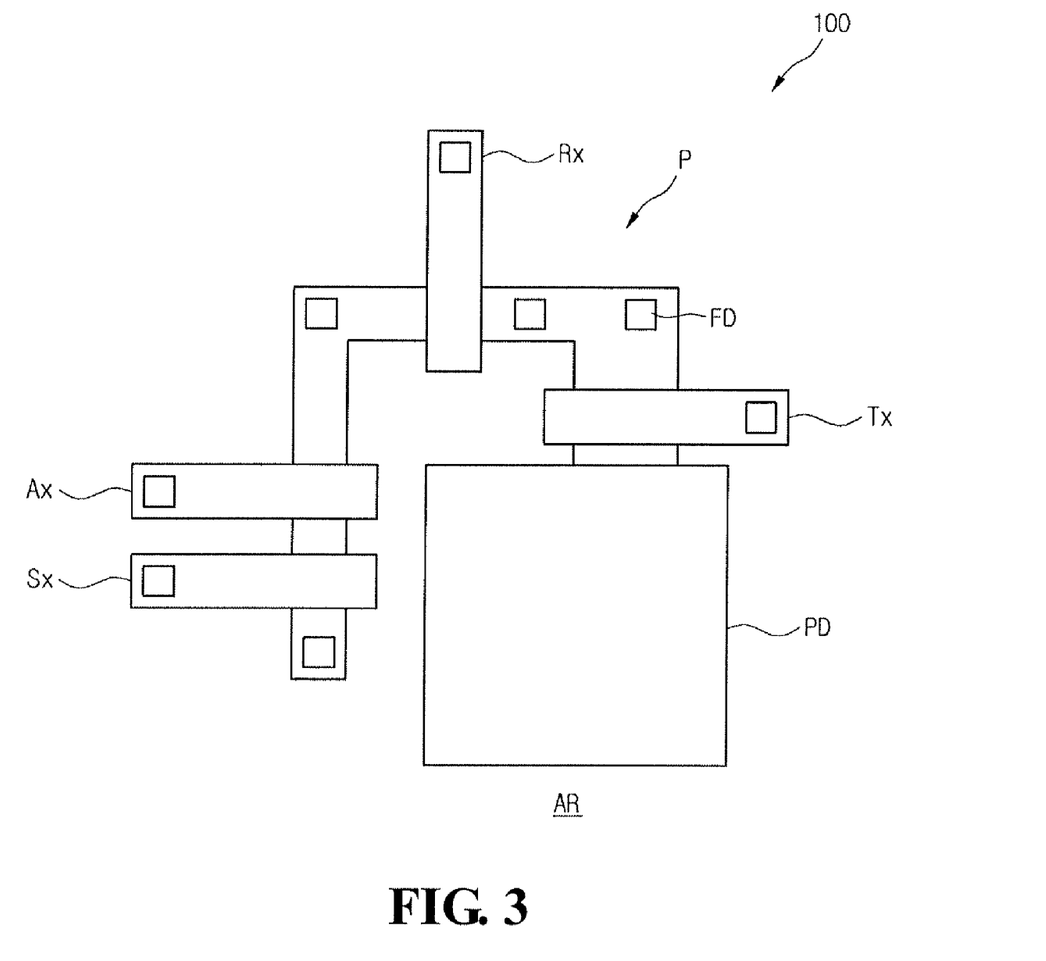
FIG. 3 is a layout view showing the pixel of FIG. 2.

Referring to FIGS. 2 and 3, each pixel P includes a photodiode PD to detect the external light and a plurality of transistors that can control the transmission and/or the output of charges stored in the photodiode PD. In an embodiment, the pixel P of the image sensor 100 includes four transistors.

The pixel P can include a photodiode PD for sensing light, a transfer transistor Tx, a reset transistor Rx, a select transistor Sx, and an access transistor Ax.

The photodiode PD can be connected to the transfer transistor Tx, which can be serially connected to the reset transistor Rx. A source of the transfer transistor Tx can be connected to the photodiode PD, and a drain of the transfer transistor Tx can be connected to a source of the reset transistor Rx. Power supply voltage VDD can be applied to a drain of the reset transistor Rx.

The drain of the transfer transistor Tx can serve as a floating diffusion region FD. The floating diffusion layer FD can be connected to a gate of the access transistor Ax. The select transistor Sx can be serially connected to the access transistor Ax, such that the source of the access transistor Ax can be connected to the drain of the source transistor Sx. The power supply voltage VDD can be applied to both the drain of the access transistor Ax and the drain of the reset transistor Rx. A source of the select transistor Sx can correspond to an output terminal, and a selection signal can be applied to the gate of the select transistor Sx.

The potential of the floating diffusion region FD can be adjusted by turning on the reset transistor Rx. Once the potential of the floating diffusion region FD is substantially identical to the power voltage source VDD, the reset transistor Rx can be turned off. This operation is called a reset operation.

If external light is incident into the photodiode PD, electron-hole pairs (EHPs) are generated, thereby filling the photodiode PD with signal electric charges. If the transfer transistor Tx is turned on, the signal electric charges of the photodiode PD can be output to and stored in the floating diffusion region FD. Accordingly, the potential of the floating diffusion region FD can be changed in proportion to the charges output from the photodiode PD. This can cause the potential of the gate of the access transistor Ax to change. If the select transistor Sx is turned on by the selection signal, data are output to the output terminal. Then, the pixel P can perform the reset operation. Each pixel P can repeatedly perform the above procedure to convert optical signals into electrical signals.

Figure 4:
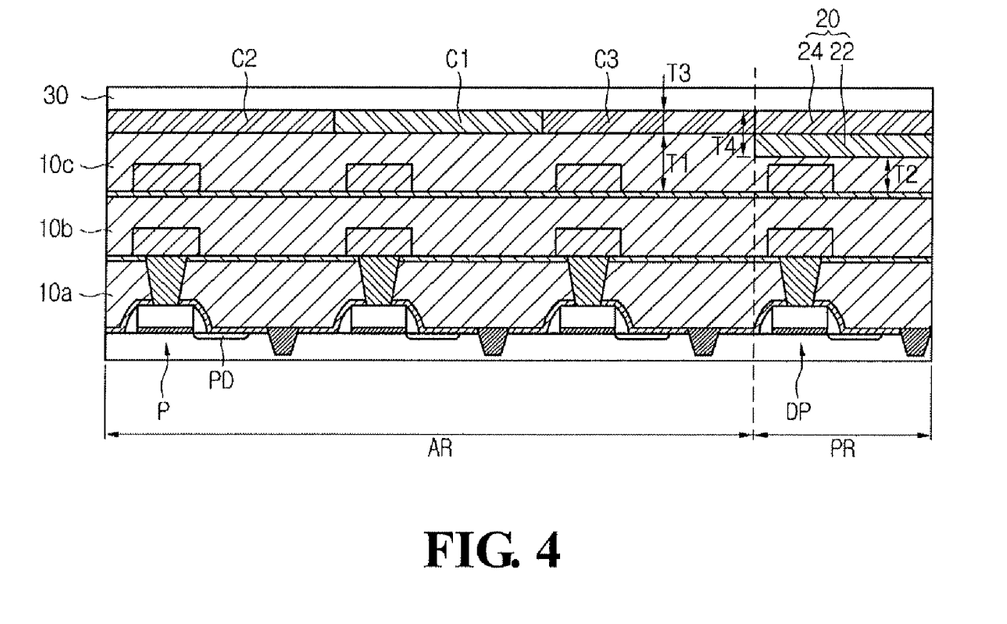
FIG. 4 is a cross-sectional view according to an embodiment of the present invention taken along line I-I' of FIG. 1.

FIG. 4 is a cross-sectional view taken along line I-I' of FIG. 1.

Referring to FIGS. 1 and 4, dummy pixels DP can be provided in the peripheral region PR. The structure and arrangement of the dummy pixels is substantially identical to that of the pixel P provided in the active region AR. The dummy pixels help make the height of the peripheral region PR substantially the same as that of the active region AR, thereby inhibiting the occurrence of a step difference between the active region AR and the peripheral region PR.

An interlayer dielectric layer can be formed on the substrate including on both the pixel P and the dummy pixel DP. In many embodiments, multiple interlayer dielectric layers can be formed. In an embodiment, three interlayer dielectric layers 10a, 10b, and 10c can be formed on the substrate of the active region AR and the peripheral region PR. A portion of the uppermost interlayer dielectric layer 10c in the active region AR can have a first thickness T1, and a portion of the upper-most interlayer dielectric layer 10c in the peripheral region PR can have a second thickness T2, such that the first thickness T1 is larger than the second thickness T2. In embodiments with only one interlayer dielectric layer, the first thickness T1 and the second thickness T2 correspond to the thickness of the one interlayer dielectric layer in the active region AR and the peripheral region PR, respectively. In embodiments with two interlayer dielectric layers or more than three interlayer dielectric layers, the first thickness T1 and the second thickness T2 correspond to the thickness of the uppermost interlayer dielectric layer in the active region AR and the peripheral region PR, respectively.

A first color filter C1, a second color filter C2, and a third color filter C3 can be provided in the active region AR. One color filter can be provided for each pixel P. In an embodiment, the first color filter C1, the second color filter C2, and the third color filter C3 each have the same thickness T3.

A light blocking member 20, with a thickness T4, can be provided in the peripheral region PR. In an embodiment, the light blocking member 20 reflects or absorbs light incident into the peripheral region PR, thereby inhibiting the light incident into the peripheral region PR from entering the active region AR.

In an embodiment, the sum of the thickness T4 of the light blocking member 20 and the second thickness T2 of the interlayer dielectric layer 10c in the peripheral region is substantially identical to the sum of the thickness of each color filter T3 and the first thickness T1 of the interlayer dielectric layer in the active region AR. Accordingly, the top surfaces of the color filters (C1, C2, and C3) and the light blocking member 20 are substantially planar.

Thus, the portion of the interlayer dielectric layer 10c in the peripheral region PR can be thinner than the portion in the active region AR. The light blocking member 20 can be formed to a thickness approximately equal to the thickness difference of the interlayer dielectric layer between the active region AR and the peripheral region PR plus the thickness of a color filter (C1, C2, or C3). This can lead to substantially no step difference between the top surface of the light blocking member 20 and the top surface of the color filters (C1, C2, and C3).

The light blocking member 20 can include a first light blocking member 22 and a second light blocking member 24. The second light blocking member 24 can be provided on the first light blocking member 22. In an embodiment, the first light blocking member 22 can be the substantially identical to the first color filter C1, and the second light blocking member 24 can be substantially identical to the second color filter C2. In certain embodiments, the first light blocking member can be substantially identical to any of the color filters (C1, C2, or C3), and the second light blocking member can be substantially identical to another of any of the color filters (C1, C2, or C3).

In an embodiment, the second light blocking member 24 of the light blocking member 20 can be substantially identical to the first color filter C1, and the third color filter C3 can be provided in a portion of the active region AR adjacent to the second light blocking member 24.

Figure 5:
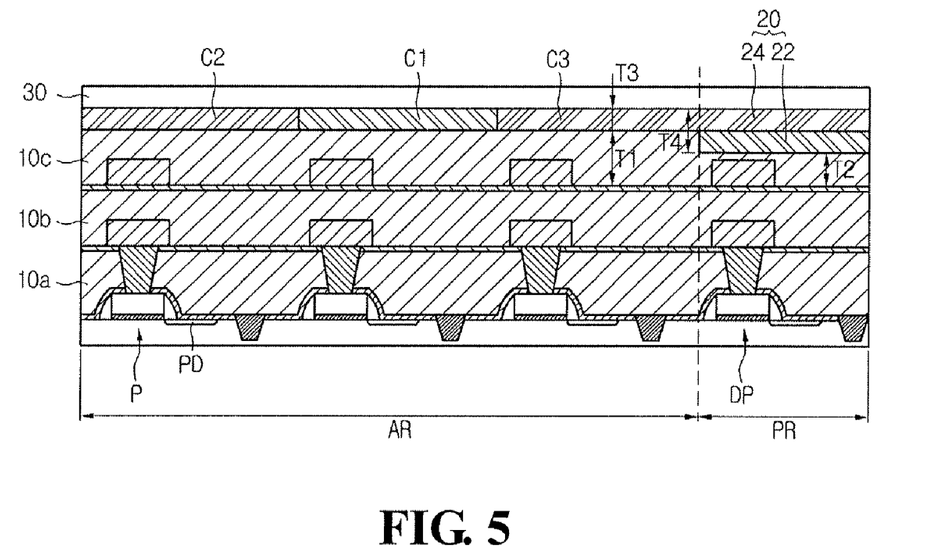
FIG. 5 is a cross-sectional view according to another embodiment of the present invention.

Referring to FIG. 5, in an alternative embodiment, the second light blocking member 24 can be substantially identical to the third color filter C3, and the third color filter C3 can be provided in a portion of the active region AR adjacent to the second light blocking member 24.

A planarization layer 30 can be provided on the color filters (C1, C2, and C3) and the light blocking member 20. In an embodiment, the planarization layer 30 can be very thin since there is substantially no step difference between the color filters (C1, C2, and C3) and the light blocking member 20.

Figure 6:
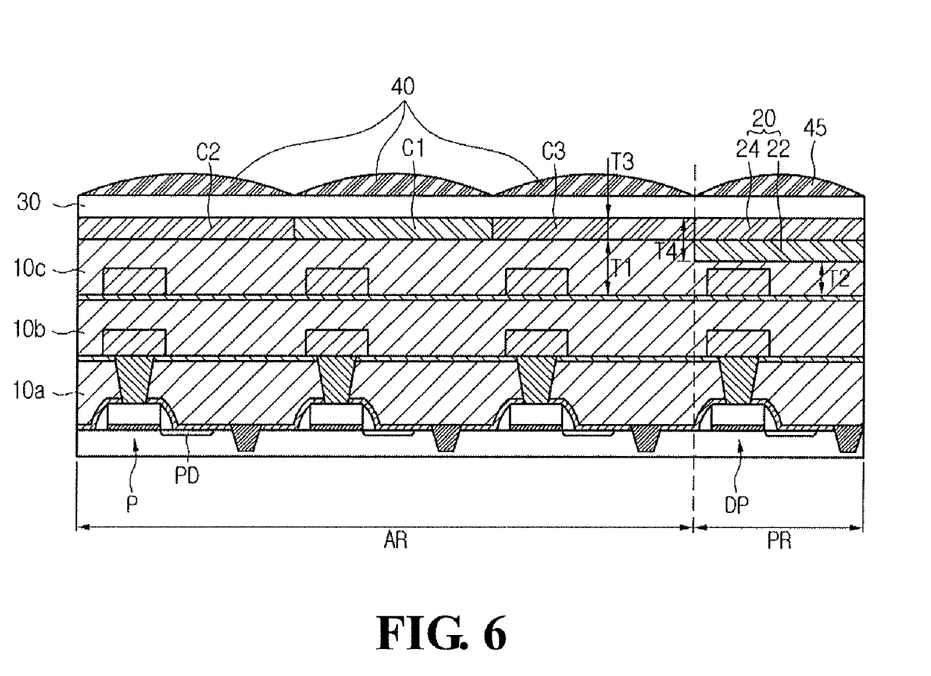
FIG. 6 is a cross-sectional view showing microlenses provided on an image sensor of FIG. 4.

Referring to FIG. 6, a plurality of microlenses 40 can be provided on the planarization layer 30. A microlens 40 can be formed on each color filter (C1, C2, and C3) in the active region AR.

In an embodiment, no microlenses are formed in the peripheral region PR. In an alternative embodiment, a dummy microlens 45 can be formed in the peripheral region PR.

FIGS. 7 to 12 are cross-sectional views showing a method for manufacturing the image sensor according to an embodiment.

Figure 7:
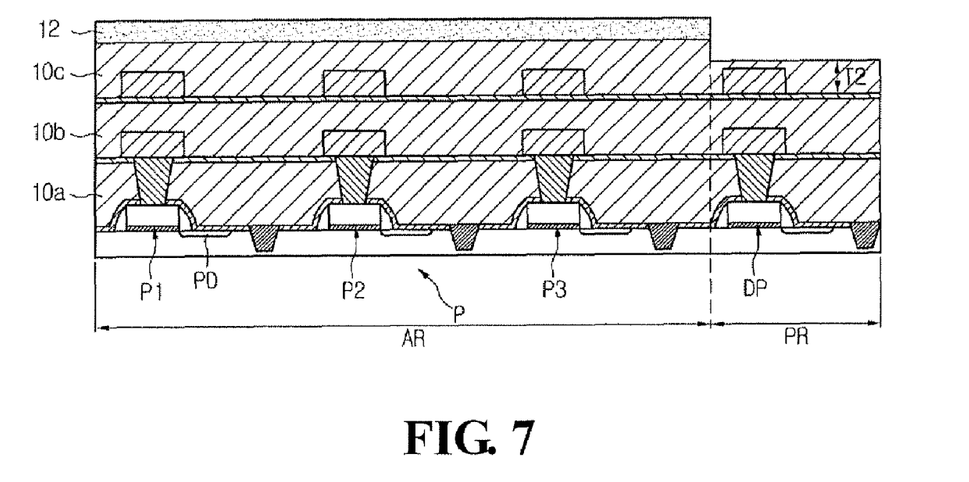
FIGS. 7 to 12 are cross-sectional views showing a method for manufacturing an image sensor according to an embodiment of the present invention.

Referring to FIG. 7, pixels P can be formed on the substrate in the active region AR, and dummy pixels DP can be formed in the peripheral region PR. In an embodiment, the pixels P include a first pixel P1, a second pixel P2, and a third pixel P3.

At least one interlayer dielectric layer can be formed on the substrate. In an embodiment, three interlayer dielectric layers 10a, 10b, and 10c can be formed on the substrate. Metal interconnection structures can be disposed among the interlayer dielectric layers 10a, 10b, and 10c. In an embodiment, the uppermost interlayer dielectric layers 10c has a first thickness T1.

A photoresist film (not shown) can be formed on the interlayer dielectric layer 10c. The photoresist film can be patterned through a photo process, which can include an exposure and development process, to form a photoresist pattern 12 on the interlayer dielectric layer 10c. The active region AR can be covered by the photoresist pattern 12, and the peripheral region PR can be exposed.

Then, the exposed portion of the interlayer dielectric layer 10c can be patterned by using the photoresist pattern 12 as an etching mask. For example, the interlayer dielectric layer 10c can be etched through a dry etching process. The exposed portion of the interlayer dielectric layer 10c in the peripheral region PR has a second thickness T2, such that the first thickness T1 is larger than the second thickness T2.

The photoresist pattern 12 can be removed. For example, the photoresist pattern 12 can be removed through an ashing/strip process.

Figure 8:
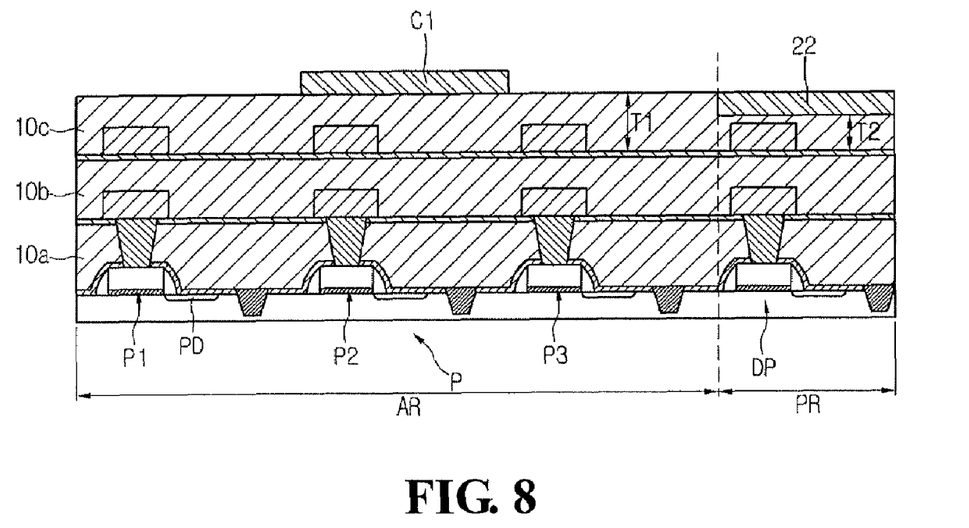

Referring to FIG. 8, the first color filter layer including the first color filter material can be formed and then patterned, thereby forming the first color filter C1 on a portion of the interlayer dielectric layer 10c in the active region AR. According to an embodiment as illustrated in FIG. 8, the first color filter C1 can be formed corresponding to the second pixel P2.

In an embodiment, the first light blocking member 22 can be formed by patterning the first color filter layer material. The thickness of the first light blocking member 22 can be substantially identical to the thickness of the first color filter C1, and the difference between the first thickness T1 and the second thickness T2 of the uppermost interlayer dielectric layer 10c can be substantially identical to the thickness of the first color filter C1. The first light blocking member 22 can be formed in the peripheral region PR when the first color filter C1 is formed in the active region AR.

Figure 9:
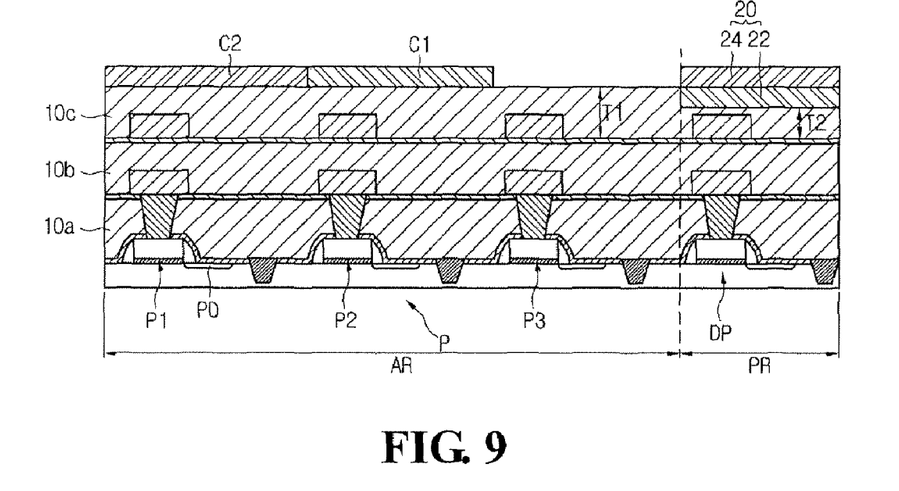

Referring to FIG. 9, the second color filter layer including the second color filter material can be formed and patterned on the interlayer dielectric layer 10c, thereby forming the second color filter C2 on a portion of the interlayer dielectric layer 10c in the active region AR. According to an embodiment as illustrated in FIG. 9, the second filter C2 can be formed corresponding to the first pixel P1.

In an embodiment, the second light blocking member 24 can be formed by patterning the second color filter layer material. The thickness of the second light blocking member 24 can be substantially identical to the thickness of the second color filter C2. The second light blocking member 24 can be simultaneously formed with the second color filter C2.

Figure 10:
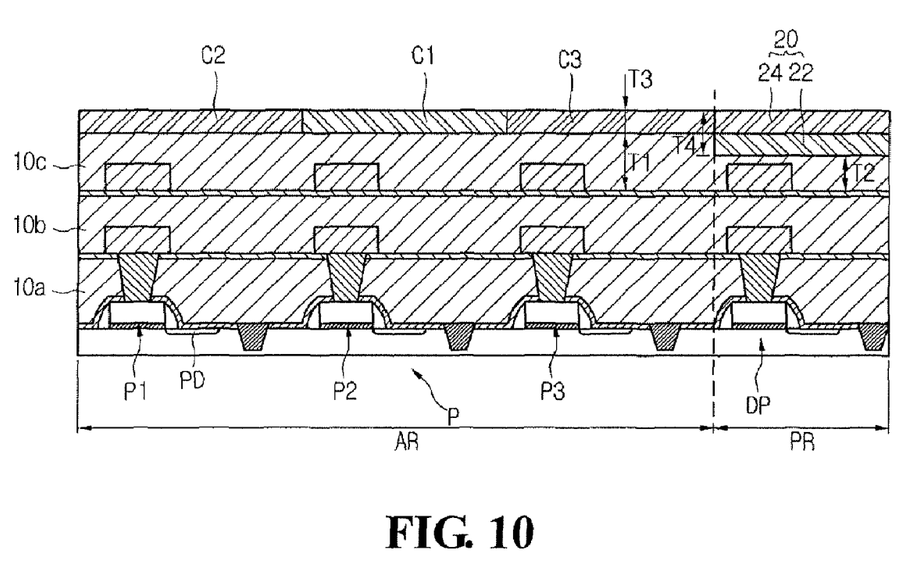

Referring to FIG. 10, the third color filter layer including the third color filter material can be formed and patterned on the interlayer dielectric layer 10c, thereby forming the third color filter C3 on a portion of the interlayer dielectric layer 10c in the active region AR. According to an embodiment as illustrated in FIG. 10, the third color filter C3 can be formed corresponding to the third pixel P3.

Figure 11:
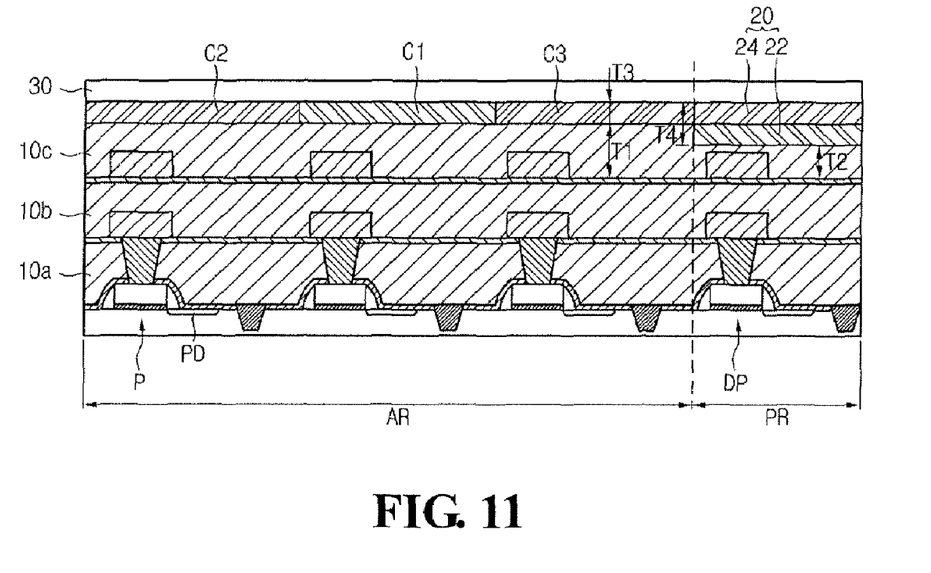

Referring to FIG. 11, a planarization layer 30 can be formed on the substrate to cover the color filters (C1, C2, and C3) and the light blocking member 20. In an embodiment, the planarization layer 30 can be very thin since there is substantially no step difference between the color filters (C1, C2, and C3) and the light blocking member 20. Accordingly, it is possible to increase the amount of incident light that reaches the pixels (P1, P2, and P3) due to the reduced thickness of the planar layer 30.

Figure 12:
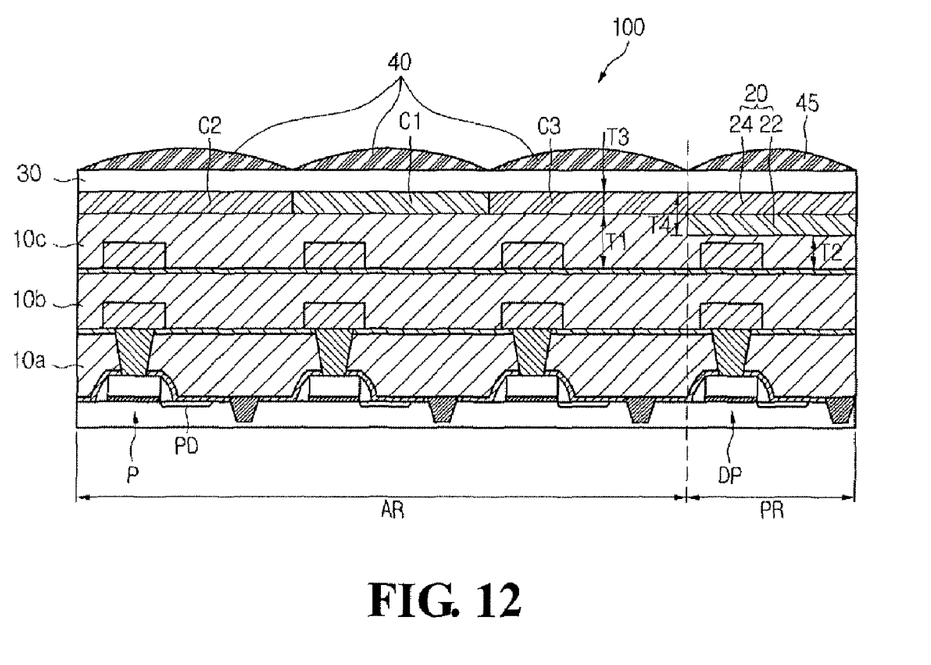

Referring to FIG. 12, in one embodiment, a photosensitive organic layer can be formed and patterned on the planarization layer 30, thereby forming microlenses 40 in the active region AR. In an embodiment, a microlens 40 can be formed on each pixel (P1, P2, and P3).

In an embodiment, a dummy microlens 45 can be formed in the peripheral region PR. In an alternative embodiment, no dummy microlens 45 is formed in the peripheral region PR.

In the image sensor and fabricating method thereof according to embodiments of the present invention, there is substantially no step difference between the color filters in the active region AR and the light blocking member in the peripheral region PR. This leads to the ability to reduce the thickness of a planarization layer covering the color filter and the light blocking member. Accordingly, the light loss that occurs due to the planarization layer can be minimized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a plurality of pixels disposed in an active region of a substrate;
    a dummy pixel disposed in a peripheral region of the substrate,
    an interlayer dielectric layer on the active region and the peripheral region, and having a first thickness in the active region and a second thickness in the peripheral region, wherein the first thickness is larger than the second thickness;
    color filters disposed on the active region;
    a light blocking member on the interlayer dielectric layer of the peripheral region, wherein there is substantially no step difference between a top surface of the light blocking member and a top surface of a color filter adjacent to the light blocking member;
    a planarization layer on the color filters and the light blocking member; and
    a dummy microlens on the planarization layer in the peripheral region,
    wherein the light blocking member is overlapped by the dummy microlens.

2. The image sensor according to claim 1, wherein the light blocking member comprises a first light blocking member on the interlayer dielectric layer of the peripheral region and a second light blocking member on the first light blocking member.

3. The image sensor according to claim 2, wherein the color filters comprise a first color filter, a second color filter, and a third color filter; and
    wherein the third color filter is adjacent to the second light blocking member.

4. The image sensor according to claim 3, wherein the first light blocking member is substantially similar to the first color filter, and wherein the second light blocking member is substantially similar to the second color filter.

5. The image sensor according to claim 3, wherein the first light blocking member is substantially similar to the first color filter, and wherein the second light blocking member is substantially similar to the third color filter.

6. The image sensor according to claim 1, further comprising a plurality of microlenses on the planarization layer in the active region.

* * * * *